(12) United States Patent
Takasugi

(10) Patent No.: US 6,466,413 B1
(45) Date of Patent: Oct. 15, 2002

(54) MAGNETIC HEAD WITH FLEXURE SYSTEM FOR REDUCED STRESS CONCENTRATION

(75) Inventor: Satoru Takasugi, Kyoto (JP)

(73) Assignee: Suncall Corporation, Kyoto-fu (JP)

( * ) Notice: Subject to any disclaimer, the term of this patent is extended or adjusted under 35 U.S.C. 154(b) by 0 days.

(21) Appl. No.: 09/461,520

(22) Filed: Dec. 14, 1999

(30) Foreign Application Priority Data

Dec. 16, 1998 (JP) .......................... 10-358198
Nov. 11, 1999 (JP) .......................... 11-320752

(51) Int. Cl.[7] .................................. G11B 5/60
(52) U.S. Cl. ....................... 360/245.9; 360/245.3
(58) Field of Search ................. 360/245.3, 245.4, 360/245.5, 245.8, 245.9

(56) References Cited

U.S. PATENT DOCUMENTS

| | | | | |
|---|---|---|---|---|
| 4,167,765 A | * | 9/1979 | Watrous | 360/103 |
| 5,353,181 A | * | 10/1994 | Frater et al. | 360/104 |
| H1425 H | * | 4/1995 | Wolter | 360/104 |
| 5,452,158 A | * | 9/1995 | Harrison et al. | 360/104 |
| 5,699,212 A | * | 12/1997 | Erpelding et al. | 360/104 |
| 5,712,748 A | * | 1/1998 | Masse | 360/104 |
| 5,805,381 A | * | 9/1998 | Resh | 360/104 |
| 5,864,445 A | * | 1/1999 | Bennin et al. | 360/104 |
| 5,982,584 A | * | 11/1999 | Bennin et al. | 360/104 |
| 6,046,887 A | * | 4/2000 | Uozumi et al. | 360/104 |
| 6,055,132 A | * | 4/2000 | Arya et al. | 360/104 |
| 6,118,637 A | * | 9/2000 | Wright et al. | 360/29.4 |
| 6,125,015 A | * | 9/2000 | Carlson et al. | 360/245.9 |
| 6,147,840 A | * | 11/2000 | Khan | 360/245.9 |
| 6,282,064 B1 | * | 8/2001 | Palmer et al. | 360/245.9 |
| 6,288,875 B1 | * | 9/2001 | Budde | 360/245.3 |

* cited by examiner

Primary Examiner—Brian E. Miller
(74) Attorney, Agent, or Firm—Perkins Coie LLP

(57) ABSTRACT

In a magnetic head suspension, a gimbal portion includes a pair of lateral arm portions located in a first plane, a slider-mounting portion and a pad stage, both of which are located in a second plane closer to a magnetic disk than the first plane. The gimbal portion further includes a pair of reinforcing portions each advancing away from the second plane towards the first plane as they extend from the pad stage so as to have a curved cross section. A wiring structure includes first and second plane portions respectively formed on the lateral arm portions and the pad stage, and inclined portions acting as a transitional portion between the first and second portions, in which the inclined portions each have at least a portion formed on a corresponding reinforcing portion.

9 Claims, 11 Drawing Sheets

MAGNETIC HEAD WITH FLEXURE SYSTEM FOR REDUCED STRESS CONCENTRATION

BACKGROUND OF THE INVENTION

1. Field of the Invention

The present invention relates to a magnetic head suspension for use in a rigid magnetic recording disk drive (hereinafter abbreviated to as HDD), and particularly to a wiring integrated suspension.

2. Discussion of the Background

A magnetic head suspension for HDD generally includes a flexure with a plate-shaped substrate that supports a magnetic head slider thereon, and a load beam that supports the said flexure in its lengthwise direction and includes a flexible portion that biases the slider flying on air by air pressures produced by rotation of a magnetic disk towards the disk surface.

There is a demand for supporting the magnetic head slider on the flexure, allowing the said slider to pitch and roll following the disk surface. To meet this demand, various flexures have been proposed. A most frequently used flexure among them is a so-called Watrous-type flexure, which is disclosed in the U.S. Pat. No. 4,167,765.

There is another demand in recent years for designing a magnetic head suspension having an arrangement that a part of wiring for connection between a magnetic head and an external signal member are integrally formed on the flexure to constitute a wiring structure, for the purpose of improving stability in attitude of a flying magnetic head slider, and reducing manufacturing steps of magnetic head sliders. This wiring structure generally includes a polyimide insulating layer laminated on the substrate of the flexure, a wiring conductor formed on the said polyimide insulating layer, and a polyimide protection layer covering the said wiring conductor.

FIGS. 15 and 16 illustrate a flexure 110 of the Watrous-type with an integrally formed wiring structure thereon, which is used for simultaneously achieving both demands as mentioned above. Specifically, FIG. 15 is a perspective view of a distal end portion of the said flexure 110, and FIG. 16 is a rear side view of the distal end portion of the flexure 110 as viewed from the opposite side to a side, on which the slider is supported. FIGS. 17 and 18 illustrate a suspension 100 with the flexure and a load beam 120 supporting the said flexure 110. Specifically, FIG. 17 is a side view of a distal end portion of the said suspension 100, and FIG. 18 is a view as viewed in the direction of the arrow E in FIG. 17. In FIG. 18, a reference numeral 150 represents a magnetic head slider.

As illustrated in FIGS. 15 to 18, the flexure 110 of the Watrous-type includes a plate-shaped substrate that, in turn, includes a base portion 111a and a gimbal portion 111b distally extending from the said base portion 111a. The said gimbal portion 111b includes a pair of lateral arm portions 113 distally extending from the lateral side edges of the base portion 111a in such a manner as to be located in the same plane as that of the base portion, a connection portion 114 for connection between a pair of the lateral arm portions 113 at the distal ends of said lateral arm portions, and a slider-mounting portion 115 proximally extending from the substantial center of the connection portion 114 and located in a space between the lateral arm portions. The connection portion 114 has an offset bending portion 114a formed thereon that allows the slider-mounting portion 115 to be located in a second plane closer to the magnetic disk than a first plane, in which the base portion 111a and the lateral arm portions 113 are located.

The wiring structure 130 integrally formed on the flexure 110 includes a first plane portion 130a formed on the base portion of the flexure and the lateral arm portions, a second plane portion 130b formed on the slider-mounting portion, and an inclined portion 130c located between the first plane portion 130a and the second plane portion 130b. The said inclined portion 130c is a wire-bridging portion, under which no substrate support exists. Omitting the wiring structure on the connection portion 114 prevents the wiring structure from being damaged during forming of the offset bending portion 114a of the said connection portion 114.

On the other hand, the load beam 120 is provided on the distal end thereof with a protuberance 121 that is adapted for abutting against the rear side of the slider-mounting portion 115. With this arrangement, the slider-mounting portion 115 can pitch around a first axis parallel to the lengthwise direction of the suspension and roll around a second axis orthogonal to the said first axis and parallel to a slider mounting surface, with the protuberance 121 being a fulcrum, thereby allowing the slider mounted on the slider-mounting portion 115 to pitch and roll following the disk surface. The slider-mounting portion 115 is offset to the lateral arm portions 113, so that the slider can be prevented from contacting the lateral arm portions 113, even if the said slider is of such a dimension as to straddle over the lateral arm portions 113.

Although the suspension of FIGS. 17 and 18 produces the aforementioned effects, it is accompanied by the following disadvantages. That is, the suspension of the arrangement illustrated in FIGS. 17 and 18 causes the inclined portion 130c to have stepped portion in order to be in conformity with the stepped configuration of the offset bending portion, This results in the formation of a bent part along the boundaries between the inclined portion and the first plane portion 30a or the second plane portion 130b, so that stress is concentrated into the bent part, thereby increasing the possibility of damaging the wiring structure.

FIGS. 19 and 20 illustrate a Watrous-type flexure 110' of a different example with the integrally formed wiring structure, in which corresponding or identical parts to those of the flexure 110 have been given the same reference characters to omit a detailed description thereof. The flexure 110' includes a pad stage 116 distally extending from the connection portion 114. The said pad stage 116 forms thereon the second plane portion 130b of the wiring structure. As is the case with the flexure 110, the entire region of the inclined portion 130c of the wiring structure is formed as the wire-bridging portion.

The flexure of FIGS. 19 and 20 includes the inclined portions 130c, the total length of which is longer than the connection portion 114, so that each of the said inclined portions has a gentle inclination as compared with the inclination in a corresponding offset bending portion 114a. Thus, the flexure 110' of this arrangement lowers stress concentration in the inclined portions 130c of the wiring structure as compared with the flexure 110 as illustrated in FIGS. 15 to 18.

However, according to the flexure 110' as illustrated in FIGS. 19 and 20, the entire region of each of the inclined portions 130c is formed as the wire-bridging portion with no support by the substrate, and the inclined portions 130c protrude sideways from the flexure substrate as viewed from above, so that any parts or matters are likely to contact the inclined portions of the wiring structure during assembly of the suspension or HDD, thereby increasing the possibility of damaging or deformation of the wiring structure. In addition, the wire-bridging portion which is not supported by the flexure substrate increases the possibility of causing the wiring structure to be vibrated by air pressures by rotation of the magnetic disk.

FIGS. 21 to 23 illustrate a flexure 110" of still a different example, which figures respectively illustrate a perspective view of a distal end portion of the said flexure, a rear view of the said flexure, and a view as viewed in the direction of F in FIG. 22, illustrating the state that the load beam 120 is joined to the flexure. The said flexure 110" includes a pair of reinforcing portions 117, which extend in the lateral direction of the flexure from the pad stage 116. The said flexure 110" includes the inclined portions 130c each having a shorter length, thereby lowering the possibility of damaging or deforming of the wiring structure 130, and limiting the vibration. However, a problem arises in this flexure, as is the case with the flexure of FIGS. 15 to 18. Specifically, the inclination of the inclined portions 130c becomes sharper. This poses a problem of inviting stress concentration in the said portions.

SUMMARY OF THE INVENTION

An object of the invention is therefore to provide a wiring integrated magnetic head suspension that is capable of lowering stress concentration in a limited portion of the wiring structure to prevent damages or deformations of the said wiring structure, as well as limiting vibration of the wiring structure.

To achieve the above object, there is provided a magnetic head suspension including a wiring integrated flexure having a plate-shaped substrate for supporting a magnetic head and a wiring structure integrally formed on the said substrate for connection between the magnetic head and an external wiring member, a load beam joined to the said substrate in the lengthwise direction so as to constitute a suspension in conjunction with the said flexure. The said flexure substrate includes a base portion joined to the load beam, and a gimbal portion distally extending from the said base portion so as to support the magnetic head slider. The gimbal portion includes a pair of lateral arm portions each distally extending from a corresponding lateral side edge of the base portion, a connection portion for connection between a pair of the said lateral arm portions, a slider-mounting portion proximally extending from the connection portion and located in a space between the lateral arm portions, and a pad stage distally extending from the connection portion. The connection portion defines therein an offset bending portion that allows the slider-mounting portion and the pad stage to be located in a second plane closer to a magnetic disk than a first plane, in which the base portion and the lateral arm portions are located. The gimbal portion further includes a pair of reinforcing portions extending outwardly in the lateral direction of the flexure from the pad stage. The reinforcing portions each advance away from the second plane towards the first plane as they extend from the pad stage so as to have a curved cross section. The wiring structure includes a first plane portion located on the base portion of the flexure substrate and the lateral arm portions, a second plane portion located on the pad stage, and inclined portions as a transitional portion between the first plane portion and the second plane portion. At least a portion of each of the inclined portions of the wiring structure is formed on a corresponding reinforcing portion.

With the above arrangement, each inclined portion can have a smaller angle, so that the stress concentration in the inclined portions of the wiring structure can be lowered so as to effectively prevent damages or deformations of the inclined portions of the wiring structure. In addition, at least a portion of each of the inclined portions is formed on a corresponding reinforcing portion, thereby effectively suppress vibration of the inclined portions of the wiring structure, which vibration occurs with air pressures caused by the rotation of the magnetic disk.

The reinforcing portions each preferably have a width wider than that of the wiring structure which is formed on the said reinforcing portions, and at least a portion of each reinforcing portions defines a drawing-out portion to reduce rigidity of a corresponding reinforcing portion so as to be formed with a curved cross section during forming of the offset bending portion of the connection portion.

According to the above arrangement, the reinforcing portions each having a width wider than that of the wiring structure formed on the said reinforcing portions can prevent contact of the other parts or matters coming from sidewards of the flexure to the wiring structure, and more effectively prevent the vibration of the wiring structure. In addition, it is possible to omit an additional step of forming the reinforcing portions with the curved cross section by defining the drawing-out portion in the at least a portion of each reinforcing portions for reducing rigidity of a corresponding reinforcing portion, allowing the reinforcing portions to be formed with the curbed cross section during forming of the offset bending portion of the connection portion.

The reinforcing portions each may have a width narrower than the wiring structure formed on the said reinforcing portions in such a manner as to be formed with a curved cross section during forming of the offset bending portion of the connection portion, and may be formed so as to exist at least a portion corresponding to an outer edge of the wiring structure formed on the reinforcing portions.

According to the above arrangement, the reinforcing portions each having a width narrower than the wiring structure can be formed with the curved cross section during forming of the offset bending portion in the connection portion, achieving the omission of an additional step of forming the reinforcing portions with the curved cross section. In addition, the reinforcing portions each supporting at least an outer edge of a corresponding inclined portion can protect the wiring structure against the contact of any parts or matters accessing thereto from the lateral side of the wiring structure, and prevent the vibration of the wiring structure to some extent. As an additional advantage, the reinforcing portions each having a narrower width than the reinforcing portions in the aforementioned embodiments reduce undesirable influences over the attitude angle of the slider-mounting portion, or the rigidity of the gimbal portion against pitching motion and rolling motion.

The reinforcing portions are preferably connected between the distal ends of the lateral arm portions. This arrangement can effectively prevent the damages, deformations and vibrations of the wiring structure.

The lateral arm portions each preferably have a width wider than the wiring structure located on said lateral arm portions. This arrangement can also prevent the damages, deformations and vibrations of the wiring structure on the lateral arm portions.

BRIEF DESCRIPTION OF THE DRAWINGS

The above, and other objects, features and advantages of the present invention will become apparent from the detailed description thereof in conjunction with the accompanying drawings wherein.

DETAILED DESCRIPTION OF THE PREFERRED EMBODIMENT

Embodiment 1

A first embodiment of a magnetic head suspension according to the present invention will be hereinafter described with reference to the accompanying drawings.

Figure 1:
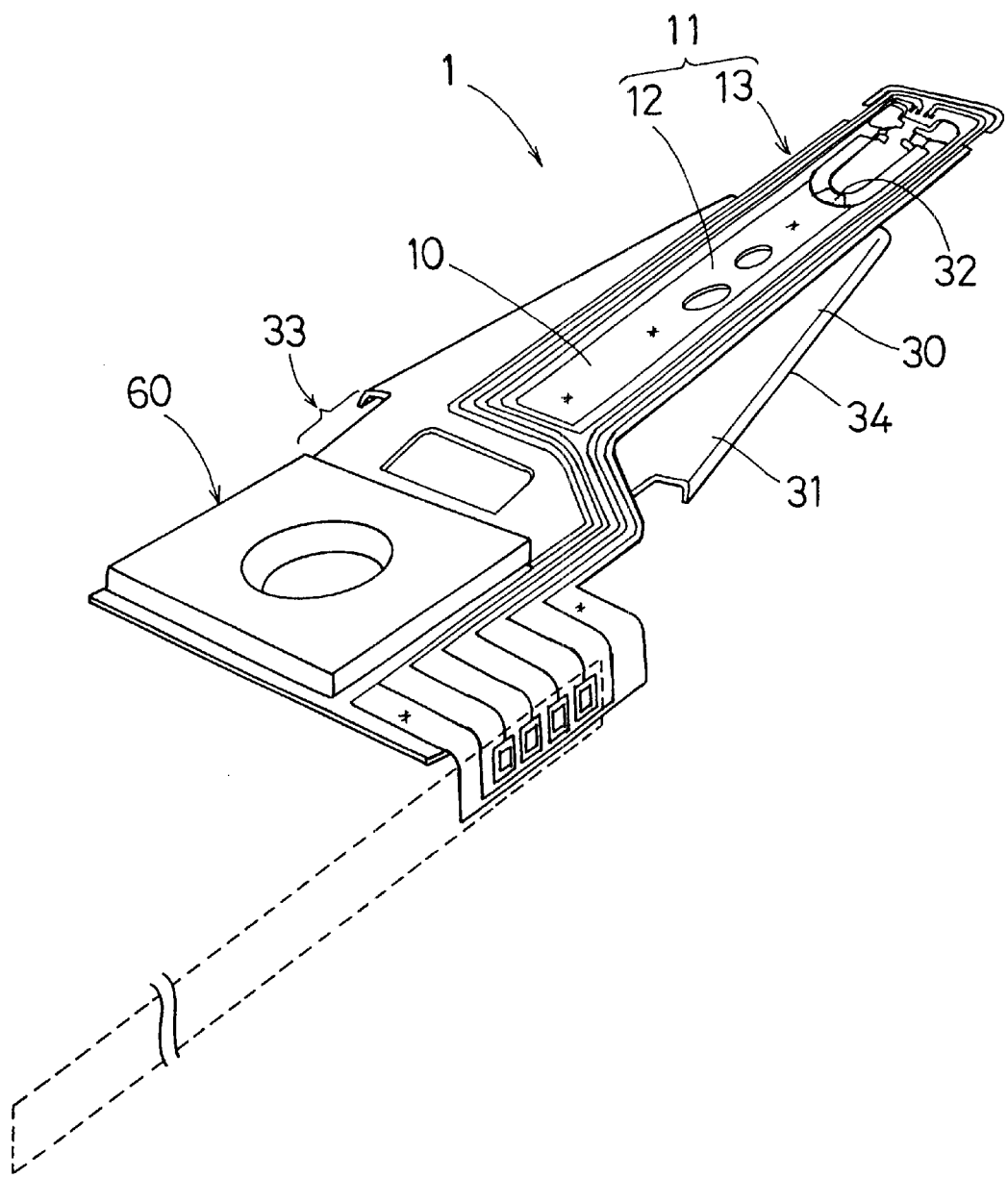
FIG. 1 is a perspective view of a distal end portion of a magnetic head suspension according to a first embodiment of the present invention.
Figure 2:
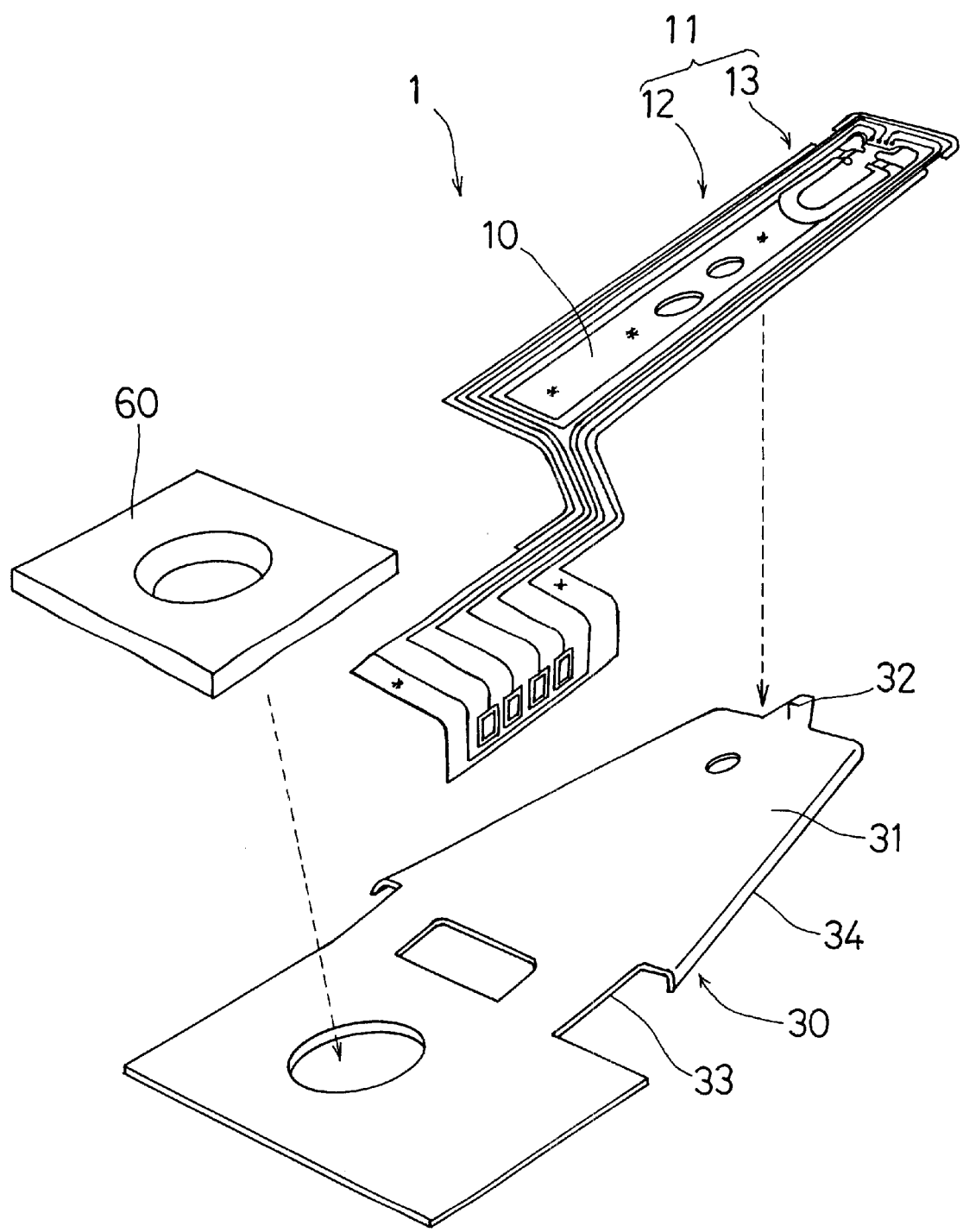
FIG. 2 is an exploded perspective view of the magnetic head suspension of FIG. 1.
Figure 3:
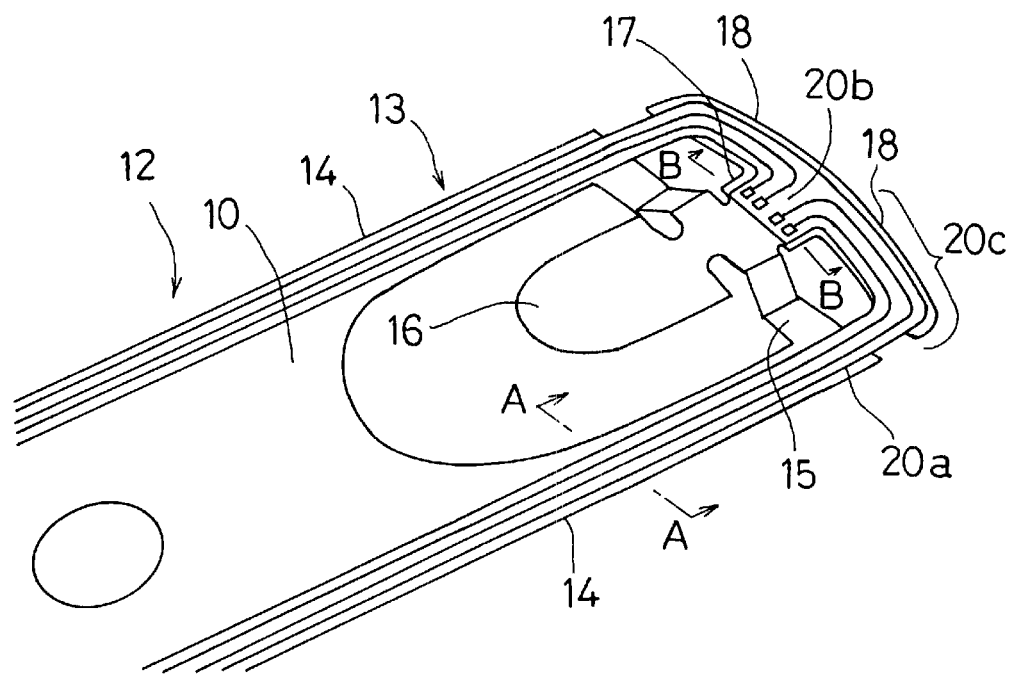
FIG. 3 is a perspective view of a distal end portion of a flexure mounted on the magnetic head suspension of FIG. 1.
Figure 4:
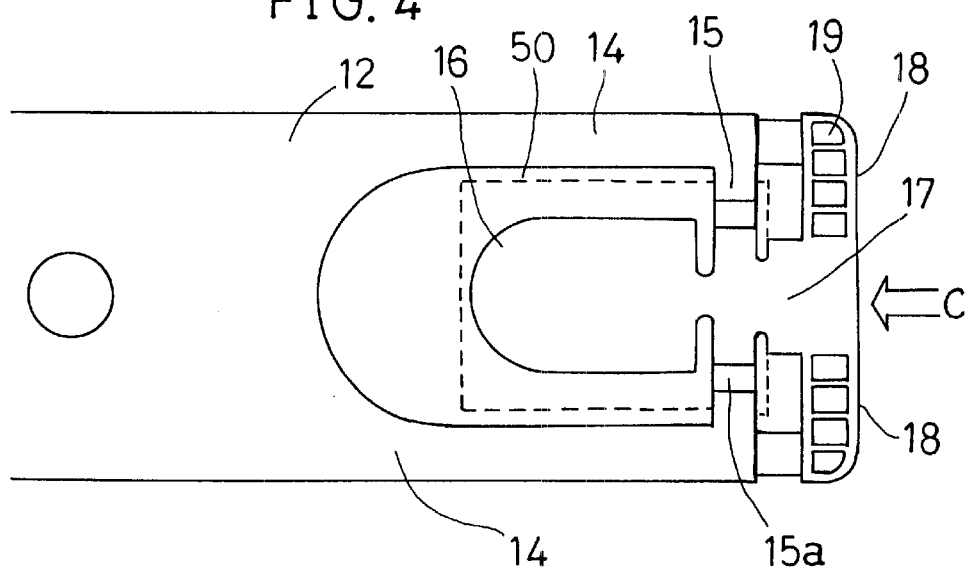
FIG. 4 is a rear view of the flexure of FIG. 3.
Figure 5:
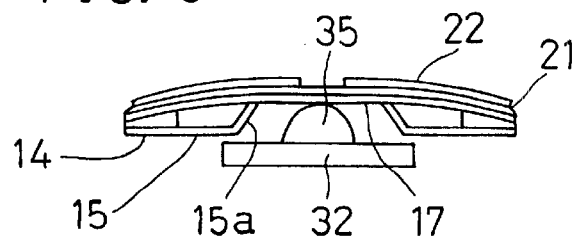
FIG. 5 is a view as viewed in the direction of the arrow C in FIG. 4.

FIGS. 1 and 2 respectively illustrate a perspective view of a suspension 1 according to this embodiment, and an exploded perspective view of the said suspension 1. FIGS. 3 and 4 respectively illustrate a perspective view and a rear view of a distal end portion of a flexure of the said suspension. FIG. 5 is a view as viewed in the direction of the arrow C in FIG. 4. The broken line of FIG. 4 indicates a magnetic head slider 50 supported by the suspension. A frequently used slider for the said slider 50 is a "pico" slider having a width of 0.69 mm, a length of 1.23 mm and a height of 0.26 mm.

As illustrated in those Figures, the suspension 1 includes a wiring integrated flexure 10 for supporting the magnetic head slider, and a load beam 30 for supporting the said flexure. The flexure 10 and the load beam 30 are joined together by a suitable means such as welding. In the Figures, a numeral reference 60 represents a base plate for securing the load beam 30 to an arm by calking, which may be omitted, for example, in the case where the load beam 30 is directly joined to the arm by welding, or other joining means. The base plate 60 is preferably formed by pressing a stainless-steel plate such as SUS305 having a thickness of approximately 0.2 to 0.3 mm.

Figure 6:
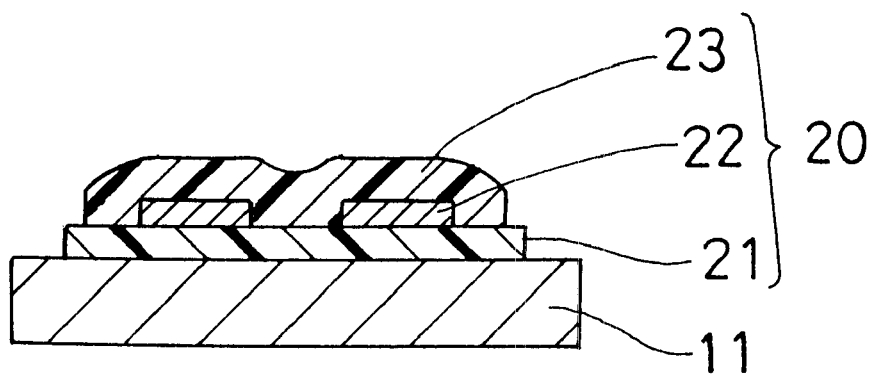
FIGS. 6 and 7 are cross sections respectively taken along the lines A—A and B—B in FIG. 3.
Figure 7:
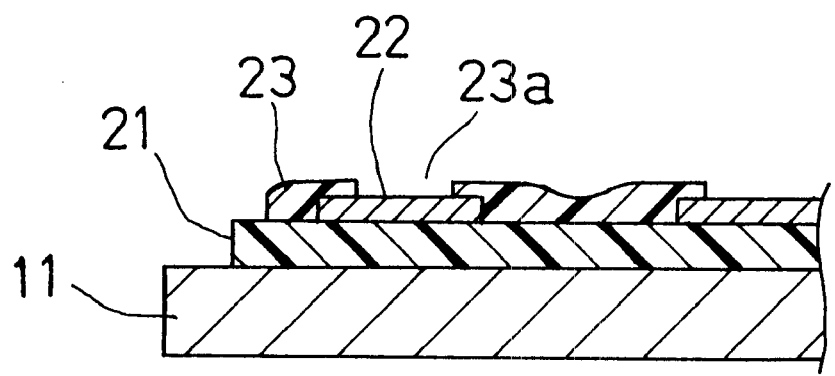

FIGS. 6 and 7 are cross sections respectively taken along the lines A—A and B—B in FIG. 3. As best illustrated in FIGS. 6 and 7, the flexure 10 includes a plate-shaped substrate 11, and a wiring structure 20 formed on the said substrate 11. The substrate 11 includes a base portion 12 overlappingly joined to the load beam, and a gimbal portion 13 distally extending from the said substrate. The gimbal portion 13 includes a pair of lateral arm portions 14 each distally extending from a corresponding lateral side edge of the base portion 12, a connection portion 15 for connection between a pair of the said lateral arm portions, a slider-mounting portion 16 proximally extending from the substantial center of the said connection portion and located in a space between the lateral arm portions, a pad stage 17 distally extending from the said substantial center of the connection portion 15, and a pair of reinforcing portions 18 extending outwardly in the lateral direction of the flexure from the said pad stage with the pad stage therebetween. The substrate may be formed of, for example, SUS304 having a thickness of 20 to 30 micrometers.

The connection portion 15 defines therein an offset bending portion 15a that allows the slider-mounting portion 16 and the pad stage 17 to be located in a second plane closer to the magnetic disk than a first plane, in which the base portion 12 and the lateral arm portions are located (see FIG. 5). The offset distance caused by the offset bending portion 15a, or the vertical interval between the first and second planes is usually in the range of approximately 25 to 50 micrometers.

The reinforcing portions 18 each advance away from the second plane towards the first plane as they extend from the pad stage 17 so as to have a curved cross section (see FIG. 5). In this embodiment, the reinforcing portions 18 each define a drawing-out portion 19 in the form of an opening having a predetermined shape and size so as to reduce rigidity of the said reinforcing portions 18 as compared with the other portions. Thus, the drawing-out portions 19 allow the reinforcing portions 18 to be formed into the aforementioned curved cross section during forming of the offset bending portion 15a in the connection portion 15, according to this embodiment. The drawing-out portions 19 in the form of the openings in this embodiment may be in the form of cutouts.

The reinforcing portions 18 and the lateral arm portions 14 each have a width wider than that of the wiring structure 20 which is formed on the said reinforcing portions 18 and the lateral arm portions 14, so as to support the entire region of the said wiring structure 20. The wiring structure 20 on the lateral arm portions 14 usually has a width of approximately 0.15 to 0.25 mm, while the reinforcing portions 18 and the lateral arm portions 14 each are, for example, 0.02 to 0.04 mm wider than the width of the wiring structure.

On the other hand, the load beam 30 includes a plate-shaped body portion 31, on which the base portion 12 of the flexure substrate 11 is overlapped, a distal end portion 32 distally protruding away from the substantial center between the lateral sides of the distal end of the body portion 31. The body portion 31 includes a load-bent portion 33 generating the force to bias the magnetic head slider flying on air by air pressures produced by rotation of the magnetic disk, towards the magnetic disk, and a rail-bent portion 34 formed by bending the body portion 31 along lines in parallel with the lateral side edges of the body portion 31 so as to increase rigidity of the said body portion (see FIGS. 1 and 2). The distal end portion 32 of the load beam 30 is provided with a protuberance 35 in the form of a dimple protruding towards the magnetic disk. The dimple 35 is adapted for abutting against the rear side of the slider-mounting portion 16 of the flexure, thereby allowing the slider-mounting portion to pitch around a first axis parallel to the lengthwise direction of the suspension and roll around a second axis orthogonal to the said first axis and parallel to a slider mounting surface, as the dimple 35 being a fulcrum. The load beam 30 of this arrangement may be formed, for example, by forming its outer configuration by etching a stainless-steel plate of SUS304 or the like having a thickness of approximately 50 to 70 micrometers, and then defining the dimple 35 and the rail bent portion 34 by pressing. The load-bent portion 33 of the load beam 30 is formed after joining the flexure 10 and the base plate 60 together.

As best illustrated in FIG. 6, the wiring structure 20 includes an insulating layer 21 laminated on the substrate 11, a wiring conductor 22 formed on the said insulating layer 21, and a protection layer 23 covering the said wiring conductor 22. A terminal pad of the wiring structure 20 is formed by forming an opening 23a in the protection layer 23 by etching so as to expose the wiring conductor 22 via the opening 23a. The insulating layer 21, the wiring conductor 22 and the protection layer 23 are respectively, for example, a polyimide insulating layer having a thickness of 5 to 15 micrometers, a conductor layer such as a Cu containing conductor layer having a thickness of 5 to 10 micrometers, and a polyimide protection layer having a thickness of 1 to 3 micrometers. In FIGS. 1 to 5, the protection layer has been omitted.

The wiring structure 20, as best illustrated in FIGS. 1 to 5, includes a first plane portion 20a located on the base portion 12 of the flexure substrate and the lateral arm portions 14, a second plane portion 20b located on the pad stage 17, and inclined portions 20c located between the lateral arm portions 14 and the pad stage 17 to act as a transitional portion between the first plane portion 20a and the second plane portion 20b. At least a portion of each of the inclined portions 20c of the wiring structure is formed on a corresponding reinforcing portion 18.

The suspension according to this embodiment is characterized by the arrangement where:

(1) The gimbal portion 13 includes a pair of the lateral arm portions 14 each distally extending from a corresponding lateral side edge of the base portion 12, the connection portion 15 for connection between a pair of the lateral arm portions at the distal ends thereof, the slider-mounting portion 16 proximally extending from the substantial center of the said connection portion and located in a space between the lateral arm portions, and the pad stage 17 distally extending from the substantial center of the connection portion 15;

(2) The connection portion 15 defines therein the offset bending portion 15a that allows the slider-mounting portion 16 and the pad stage 17 to be located in the second plane closer to the magnetic disk than the first plane, in which the base portion 12 and the lateral arm portions 14 are located;

(3) The gimbal portion 13 further includes a pair of the reinforcing portions 18 extending outwardly from the pad stage in the lateral direction of the flexure, and the reinforcing portions 18 each advance away from the second plane towards the first plane as they extend away from the pad stage 17 so as to have a curved cross section;

(4) The wiring structure 20 formed on the flexure substrate 11 includes the first plane portion 20a located on the base portion 12 and the lateral arm portions 14, the second plane portion 20b located on the pad stage 17, and the inclined portions 20c acting as a transitional portion between the first plane portion 20a and the second plane portion 20b. At least a portion of each of the inclined portions 20c of the wiring structure is formed on a corresponding reinforcing portion 18.

The suspension of the above arrangement, thus, lowers stress concentration in the inclined portions 20c. Specifically, the longer length of each inclined portion 20c allows the inclined portion 20c to gently slope to the same height as that of the offset bending portion 15a, so that each inclined portion 20c has an angle smaller than that of a conventional suspension as illustrated in FIGS. 15, 16, and 21 to 23. Therefore, the stress concentration in the inclined portions 20c of the wiring structure can be lowered so as to effectively prevent damages of the inclined portions of the wiring structure 20. In addition, at least a portion of each of the inclined portions 20c is formed on a corresponding reinforcing portion 18, thereby providing a stabilized support to the wiring structure 20.

As an additional advantage produced by the suspension of this embodiment, the wiring structure 20 having no portions located sidewards of the flexure as viewed from above is unlikely damaged by the contact of the other parts or matters coming from sidewards of the flexure, and vibration of the wiring structure due to air pressures by the rotation of the magnetic disk.

Embodiment 2

A second embodiment of a magnetic head suspension according to the present invention will be hereinafter described with reference to the accompanying drawings.

Figure 8:
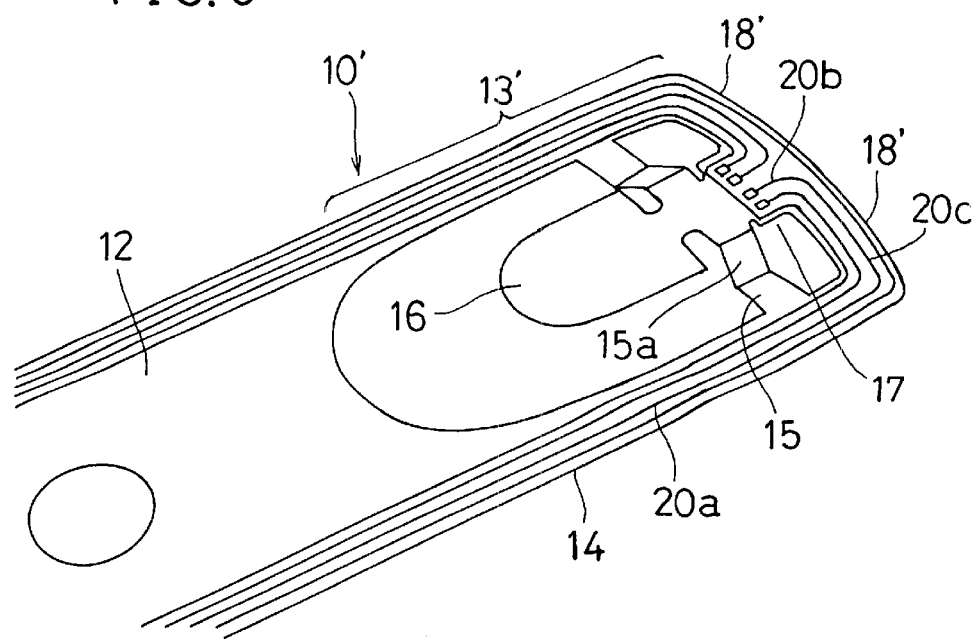
FIG. 8 is a perspective view of a distal end portion of a flexure of the magnetic head suspension in accordance with a second embodiment of the present invention.
Figure 9:
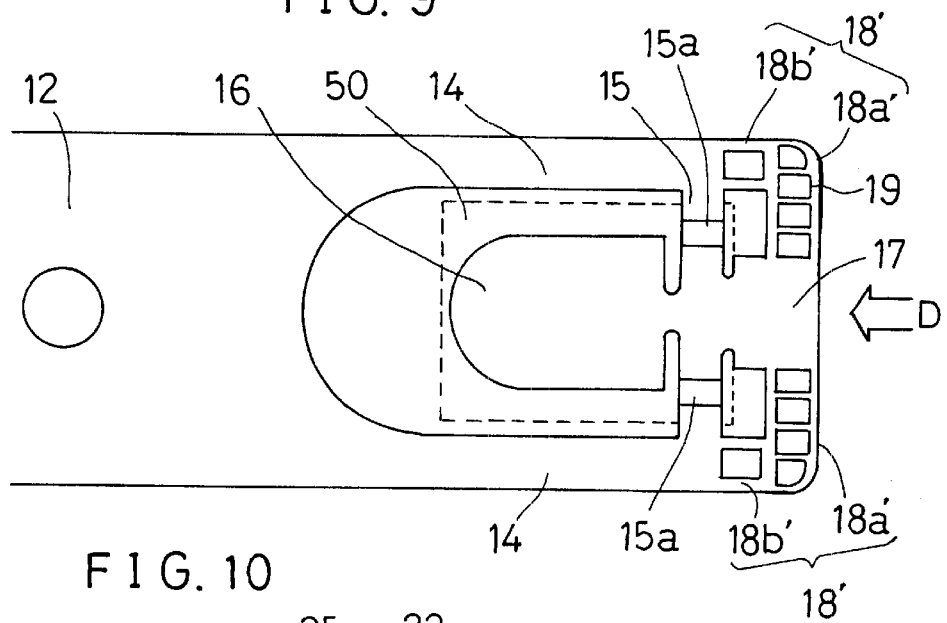
FIG. 9 is a rear view of the flexure of FIG. 8.
Figure 10:
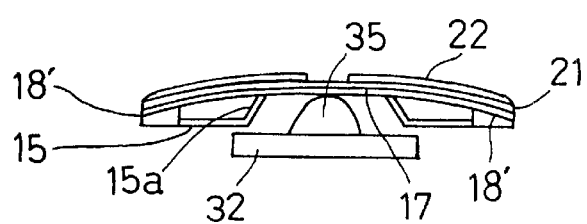
FIG. 10 is a view as viewed in the direction of the arrow D in FIG. 9, in which a load beam is joined to the flexure.

FIGS. 8 to 10 illustrate a distal end portion of a flexure 20' of a suspension 1' according to this embodiment. Specifically, FIGS. 8 and 9 are respectively a perspective view and a rear view of said distal end portion, and FIG. 10 is a view as viewed in the direction of the arrow D in FIG. 9, in which the load beam 30 is joined to the flexure. In these figures, corresponding or identical parts to those of the first embodiment have been given the same reference characters to omit a detailed description thereof.

As illustrated in FIGS. 8 to 10, the suspension 1' includes a flexure 10' instead of the flexure 10 of the first embodiment. The flexure 10' includes a gimbal portion 13' that, in turn, includes a pair of the lateral arm portions 14 each distally extending from a corresponding lateral side edge of the base portion 12, the connection portion 15 for connection between a pair of the said lateral arm portions, the slider-mounting portion 16 proximally extending from the substantial center of the said connection portion 15 and located in a space between the lateral arm portions 14, the pad stage 17 distally extending from the substantial center of the connection portion 15, and a pair of reinforcing portions 18' for connection between the said pad stage 17 and the lateral arm portions 14. The said reinforcing portions 18' each include a first portion 18a' outwardly extending from the pad stage 17 in the lateral direction of the flexure, and a second portion 18b' proximally extending in the lengthwise direction of the flexure from an outer end of a corresponding first portion 18a' and connected to the distal end of a corresponding lateral arm portion 14. Both the first portion 18a' and the second portion 18b' of each reinforcing portion 18' advance away from the second plane towards the first plane as they extend from the pad stage 17 so as to have a curved cross section.

The said reinforcing portions 18' each have a width wider than that of the wiring structure 20 formed on the reinforcing portions 18', as in the first embodiment. The said reinforcing portions 18' each define the drawing-out portion 19 having a predetermined shape and size so as to reduce rigidity of the said reinforcing portions 18' as compared with the other portions. Thus, the drawing-out portions 19 allow the reinforcing portions 18' to be formed with a curved cross section during forming of the offset bending portion 15a of the connection portion 15 (see FIG. 10).

According to this embodiment, the flexure substrate exists in the entire region of the inclined portions 20c, thereby achieving a more effective protection of the wiring structure 20 against damages, deformations, and vibration caused by air pressures by the rotation of the magnetic disk, as compared with the first embodiment.

Embodiment 3

A third embodiment of a magnetic head suspension according to the present invention will be hereinafter described with reference to the accompanying drawings.

Figure 11:
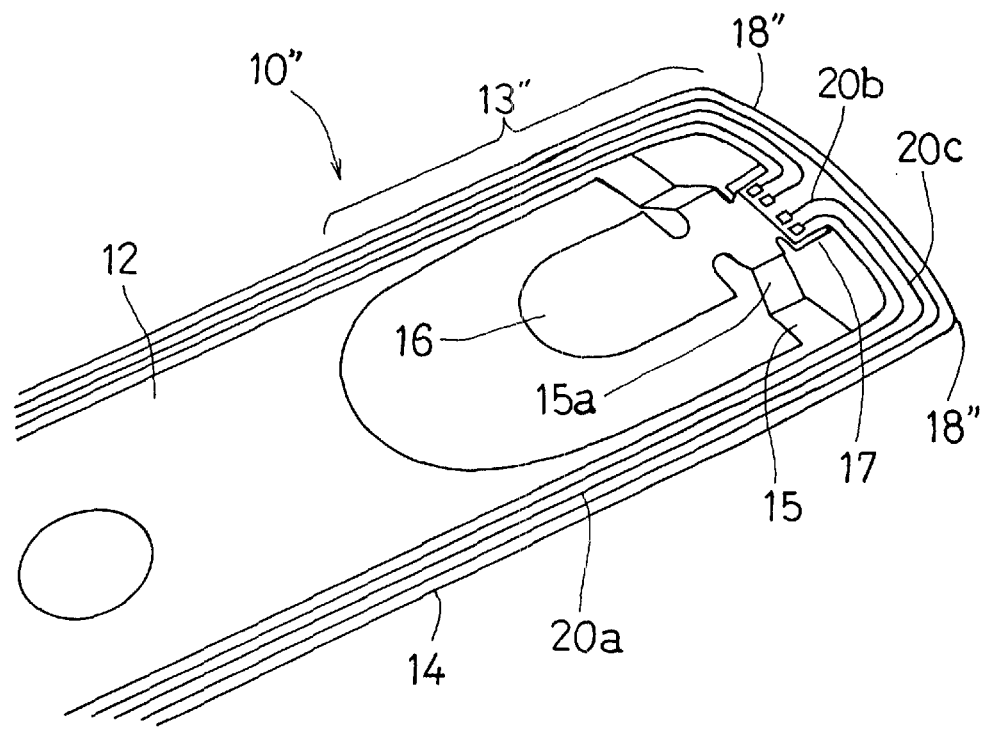
FIG. 11 is a perspective view of a distal end portion of a flexure of the magnetic head suspension in accordance with a third embodiment of the present invention.
Figure 12:
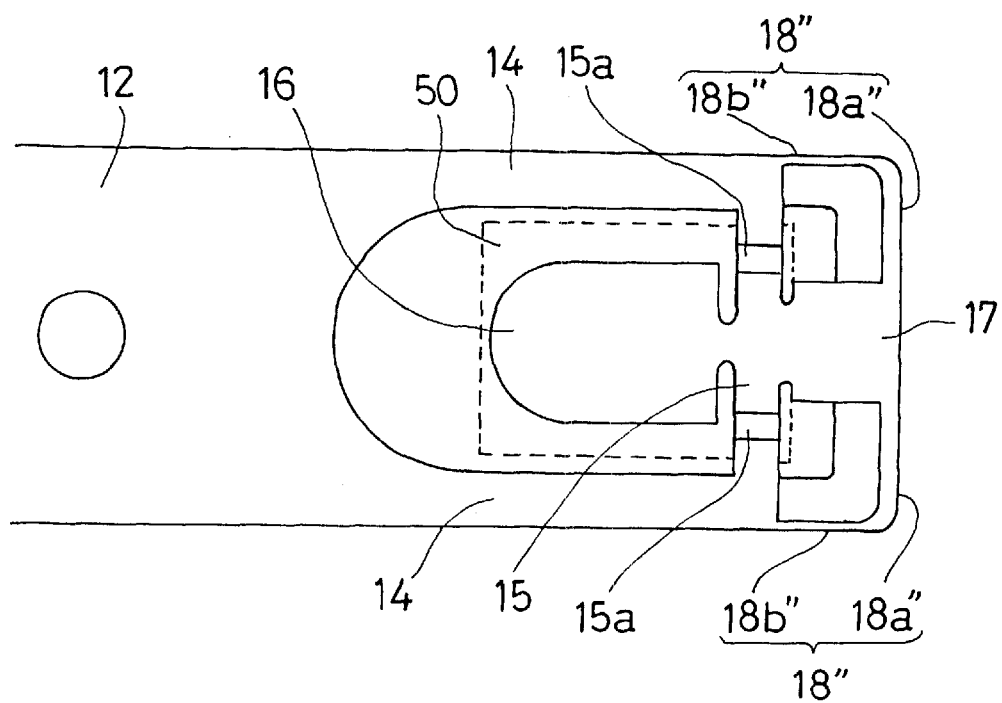
FIG. 12 is a rear view of the flexure of FIG. 11.

FIGS. 11 and 12 illustrate a distal end portion of a flexure 10" of a suspension according to this embodiment. Specifically, FIGS. 11 and 12 are respectively a perspective view and a rear view of said distal end portion. In these figures, corresponding or identical parts to those of each of the first and second embodiments have been given the same reference characters to omit a detailed description thereof.

As illustrated in FIGS. 11 and 12, the suspension of this embodiment includes a flexure 10" instead of the flexure 10 of the first embodiment. The flexure 10" includes a gimbal portion 13" that, in turn, includes a pair of the lateral arm portions 14 each distally extending from a corresponding lateral side edge of the base portion 12, the connection portion 15 for connection between a pair of the said lateral arm portions, the slider-mounting portion 16 proximally extending from the substantial center of the said connection portion 15 and located in a space between the lateral arm portions 14, the pad stage 17 distally extending from the substantial center of the connection portion 15, and a pair of reinforcing portions 18" for connection between the said pad stage 17 and the lateral arm portions 14.

The said reinforcing portions 18" each include a first portion 18a" outwardly extending in the lateral direction of the flexure from the pad stage 17, and a second portion 18b" proximally extending in the lengthwise direction of the flexure from an outer end of a corresponding first portion 18a" and connected to the distal end of a corresponding lateral arm portion 14. Both the first portion 18a" and the second portion 18b" of each reinforcing portion 18" advance away from the second plane towards the first plane as they extend from the pad stage 17 so as to have a curved cross section.

The reinforcing portions 18" each have a width narrower than that of the wiring structure to reduce the rigidity (see FIG. 12). Thus, the reinforcing portions 18 are formed with such a curved cross section during forming of the offset bending portion 15a in the connection portion 15, as in each of the aforementioned embodiments. The said reinforcing portions 18" each support at least an outer edge of a corresponding inclined portion 20c, thereby protecting the wiring structure against the contact of any parts or matters accessing thereto from the lateral side of the wiring structure.

According to this embodiment, the longer length of each inclined portion 20c allows the inclined portion 20c to gently slope to the same height as that of the offset bending portion 15a, so that each inclined portion 20c has a smaller angle of inclination than a conventional suspension, thereby lowering the stress concentration in the inclined portions 20c of the wiring structure. The presence of the substrate beneath at least an outer edge of the wiring structure 20 in this embodiment can prevent damages of the wiring structure 20 by the contact of any parts or matters accessing from the lateral side of the wiring structure. In addition, there are no portions in the wiring structure 20, on which the substrate does not exist, thereby avoiding the vibration of the wiring structure to some extent.

As an additional advantage, the reinforcing portions 18" each having a narrower width than the reinforcing portions 18 or 18' in the aforementioned embodiments reduce undesirable influences over the attitude angle of the slider-mounting portion 16, or the rigidity of the gimbal portion 13" against pitching motion and rolling motion.

Figure 13:
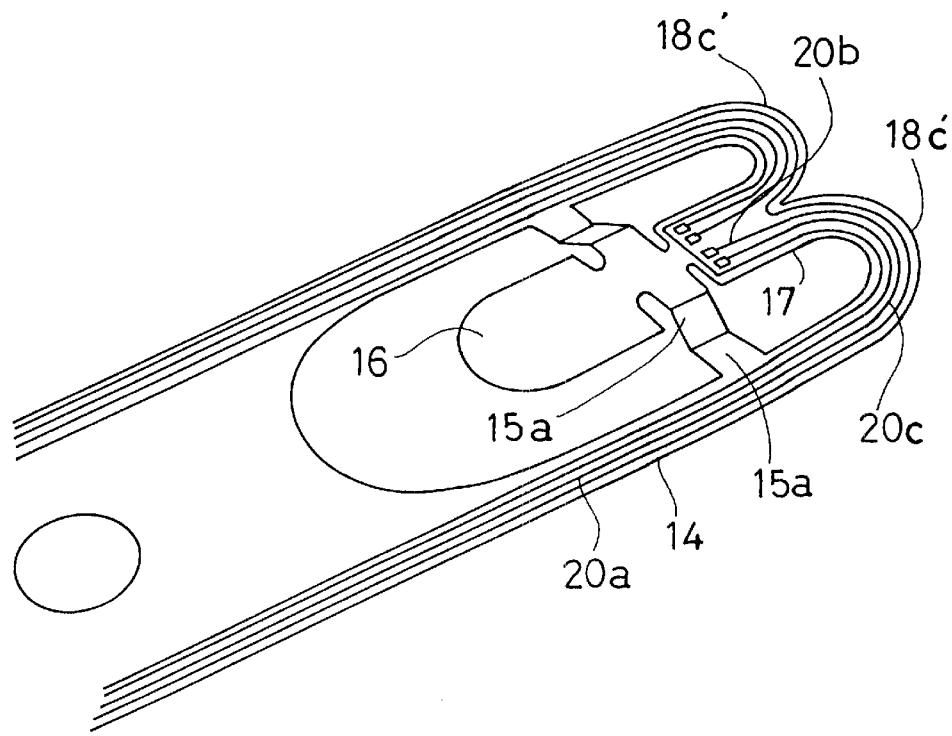
FIG. 13 is a perspective view of the flexure of FIGS. 8 to 10 with some modifications applied thereto.
Figure 14:
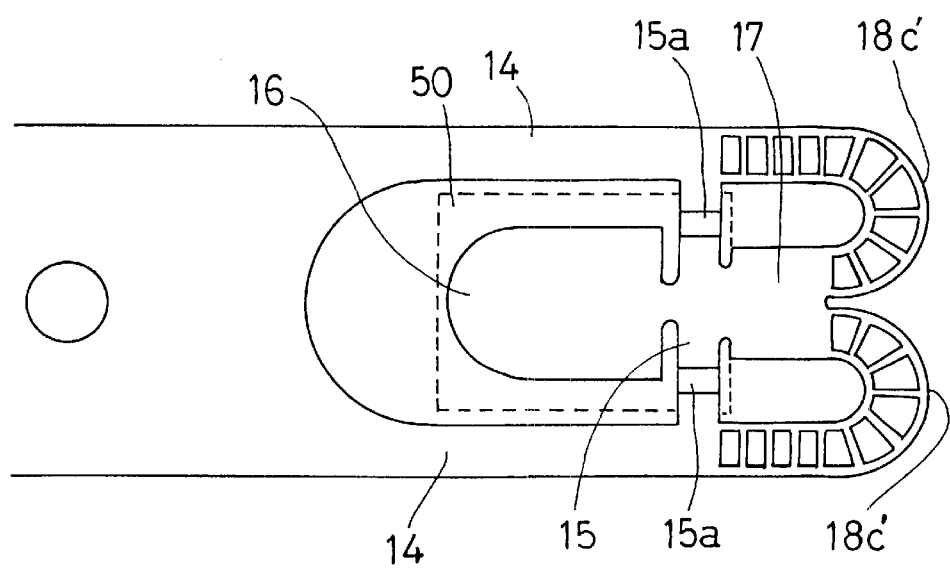
FIG. 14 is a rear view of the flexure of FIG. 13.
Figure 15:
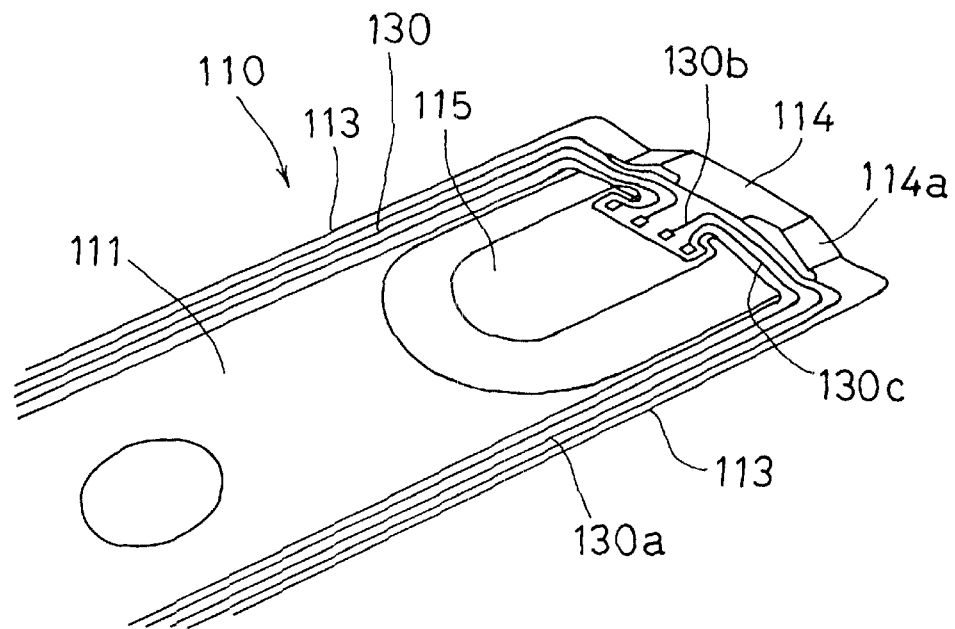
FIG. 15 is a perspective view of a distal end portion of a Watrous-type flexure, as a conventional type of a flexure, which includes an integrally formed wiring structure.
Figure 16:
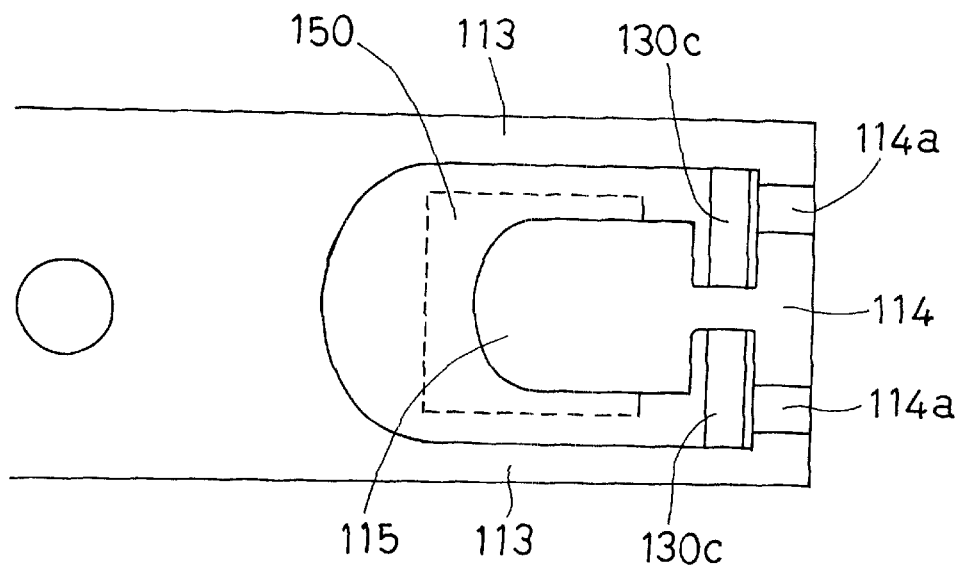
FIG. 16 is a rear view of the conventional flexure of FIG. 15.
Figure 17:
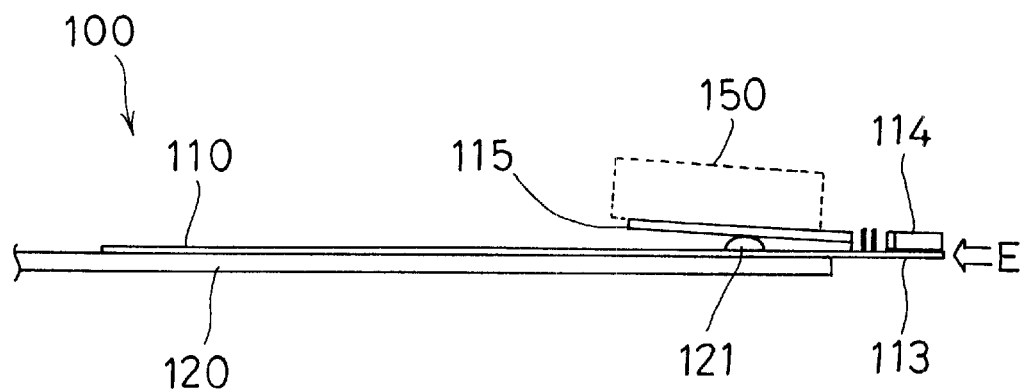
FIG. 17 is a side view of a conventional magnetic head suspension with the flexure of FIGS. 15 and 16.
Figure 18:
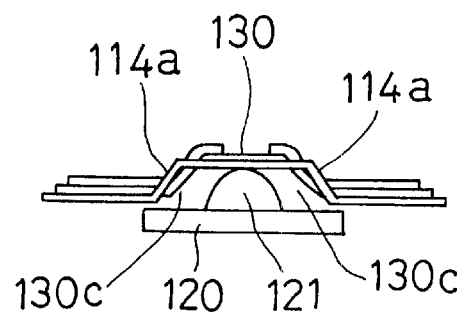
FIG. 18 is a view as viewed in the direction of arrow E in FIG. 17.
Figure 19:
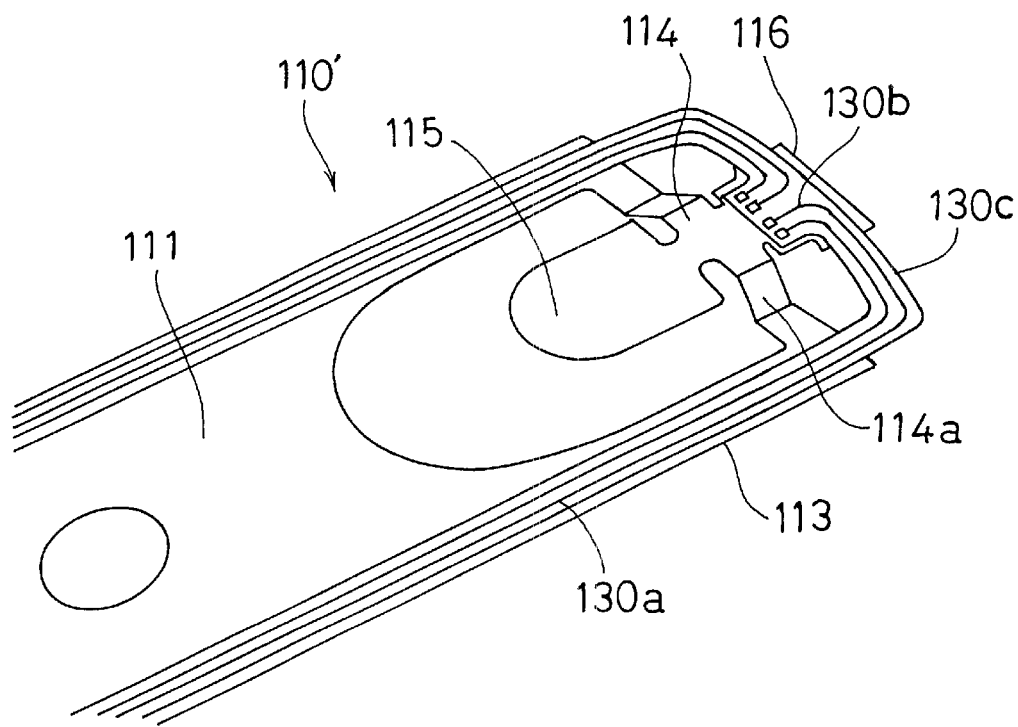
FIG. 19 is a perspective view of a distal end portion of a Watrous-type flexure of another example as a conventional type of a flexure with an integrally formed wiring structure.
Figure 20:
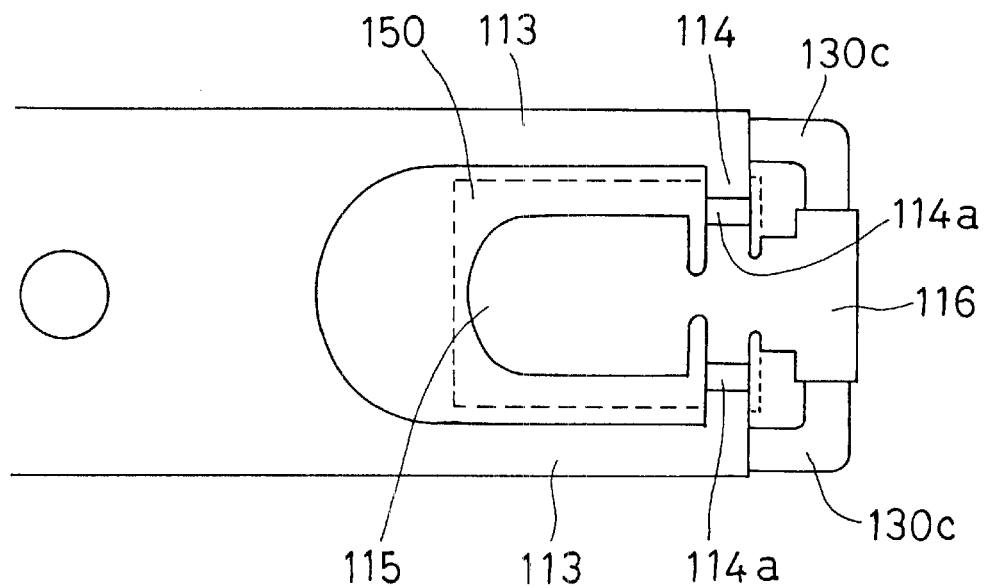
FIG. 20 is a rear view of the conventional flexure of FIG. 19.
Figure 21:
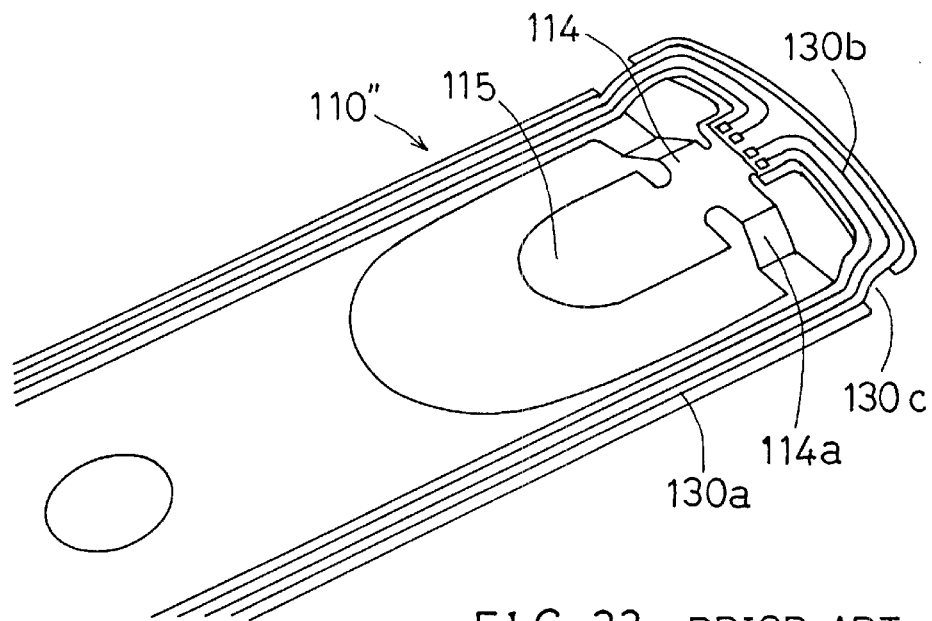
FIG. 21 is a perspective view of a distal end portion of a Watrous-type flexure of still another example as a conventional type of a flexure, which includes an integrally formed wiring structure.
Figure 22:
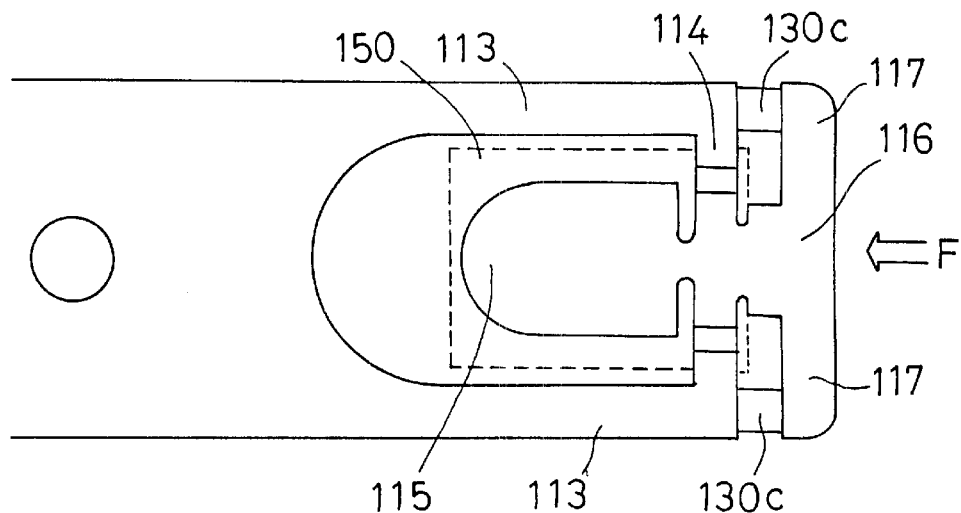
FIG. 22 is a rear view of the conventional flexure of FIG. 21.
Figure 23:
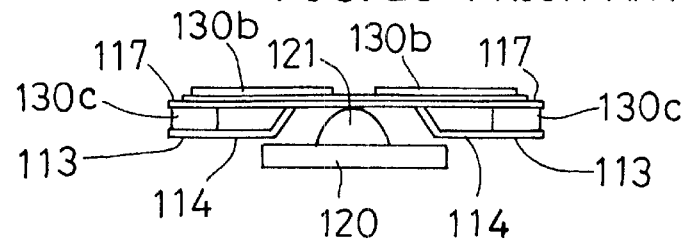
FIG. 23 is a view as viewed in the direction of the arrow F in FIG. 22, in which a load beam is joined to the flexure.

According to the aforementioned embodiments, the reinforcing portions each extend in the lateral direction of the flexure from the pad stage 17 with a distal side of each reinforcing portion being aligned with a distal side of the pad stage 17. However, this is not essential in the present invention. Various arrangements of these portions can be taken as illustrated in FIGS. 13 and 14, in which, for example, the reinforcing portions 18' of the second embodiment each have a portion 18c' which further extends from the distal side of the pad stage 17. This arrangement enables each of the inclined portions 20c to be elongated, resulting in a more gentle inclination of the said inclined portions 20c. The stress concentration in the inclined portions 20c can be thus lowered.

This specification is by no means intended to restrict the present invention to the preferred embodiments set forth therein. Various modifications to the magnetic head suspension, as described herein, may be made by those skilled in the art without departing from the spirit and scope of the present invention as defined in the appended claims.

What is claimed is:

1. A. magnetic head suspension comprising:

a wiring integrated flexure having a plate-shaped substrate for supporting a magnetic head and a wiring structure integrally formed on said substrate for connection between the magnetic head and an external wiring member;

a load beam joined to said substrate in the lengthwise direction so as to constitute a suspension in conjunction with said flexure;

said substrate including a base portion joined to the load beam, and a gimbal portion distally extending from said base portion so as to support the magnetic head slider, said gimbal portion including a pair of lateral arm portions each distally extending from a corresponding lateral side-edge of the base portion, a connection portion for connection between a pair of said lateral arm portions, a slider-mounting portion proximally extending from the connection portion and located in a space between the lateral arm portions, and a pad stage distally extending from the connection portion;

said connection portion defining therein an offset bending portion that allows the slider-mounting portion and the pad stage to be located in a second plane closer to a magnetic disk than a first plane, in which the base portion and the lateral arm portions are located;

said gimbal portion further including a pair of reinforcing portions extending outwardly in the lateral direction of the flexure from the pad stage, and said reinforcing portions each advancing away from the second plane towards the first plane as they extend from the pad stage so as to have a curved cross section, said wiring structure including a first plane portion formed on the base portion of the substrate and the lateral arm portions, a second plane portion formed on the pad stage, and inclined portions as a transitional portion between the first plane and the second plane, and said inclined portions each at least partially formed on a corresponding reinforcing portion.

2. A magnetic head suspension as set forth in claim 1, in which the reinforcing portions each have a width wider than that of the wiring structure which is formed on said reinforcing portions, and at least a portion of each reinforcing portions defines a drawing-out portion to reduce rigidity of a corresponding reinforcing portion so as to be formed with a curved cross section during forming of the offset bending portion of the connection portion.

3. A magnetic head suspension as set forth in claim 1, in which the reinforcing portions each have a width narrower than the wiring structure formed on the said reinforcing portions in such a manner as to be formed with a curved cross section during forming of the offset bending portion of the connection portion, and exist at least under an outer edge of the wiring structure formed on the reinforcing portions.

4. A magnetic head suspension as set forth in claim 1, in which the reinforcing portions are connected between the distal ends of the lateral arm portions.

5. A magnetic head suspension as set forth in claim 2, in which the reinforcing portions are connected between the distal ends of the lateral arm portions.

6. A magnetic head suspension as set forth in claim 3, in which the reinforcing portions are connected between the distal ends of the lateral arm portions.

7. A magnetic head suspension as set forth in claim 1, in which the lateral arm portions each have a width wider than the wiring structure located on said lateral arm portions.

8. A magnetic head suspension as set forth in claim 2, in which the lateral arm portions each have a width wider than the wiring structure located on said lateral arm portions.

9. A magnetic head suspension as set forth in claim 3, in which the lateral arm portions each have a width wider than the wiring structure located on said lateral arm portions.

* * * * *